(12) United States Patent
Taniguchi

(10) Patent No.: US 9,948,264 B2
(45) Date of Patent: Apr. 17, 2018

(54) ELECTRONIC COMPONENT

(71) Applicant: Murata Manufacturing Co., Ltd., Nagaokakyo-shi, Kyoto-fu (JP)

(72) Inventor: Tetsuo Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 220 days.

(21) Appl. No.: 14/943,231

(22) Filed: Nov. 17, 2015

(65) Prior Publication Data

US 2016/0149551 A1 May 26, 2016

(30) Foreign Application Priority Data

Nov. 20, 2014 (JP) ................................ 2014-235714

(51) Int. Cl.
*H03H 7/01* (2006.01)
*H03H 1/00* (2006.01)

(52) U.S. Cl.
CPC .......... *H03H 7/0115* (2013.01); *H03H 7/175* (2013.01); *H03H 7/1766* (2013.01); *H03H 2001/0085* (2013.01)

(58) Field of Classification Search
CPC .... H03H 7/0115; H03H 7/175; H03H 7/1766; H03H 2001/0085
USPC .................................................. 333/175, 185
See application file for complete search history.

(56) References Cited

U.S. PATENT DOCUMENTS

| 7,262,680 B2 | 8/2007 | Wang |
| 2002/0097128 A1 | 7/2002 | Imam |
| 2007/0069835 A1 | 3/2007 | Kamgaing |
| 2009/0121806 A1 | 5/2009 | Sasaki et al. |

(Continued)

FOREIGN PATENT DOCUMENTS

| CN | 101197461 A | | 6/2008 |
| JP | 2008-211764 | * | 9/2008 |
| JP | 2010-021321 A | | 1/2010 |

OTHER PUBLICATIONS

Machine English Translation of JP2008-211764A published on Sep. 11, 2008.*

(Continued)

*Primary Examiner* — Benny Lee
*Assistant Examiner* — Jorge Salazar, Jr.
(74) *Attorney, Agent, or Firm* — Keating & Bennett, LLP

(57) ABSTRACT

An electronic component includes a spiral or substantially spiral first inductor extending along a stacking direction while turning around a ring-shaped or substantially ring-shaped path. The first inductor includes first inductor conductors and a first interlayer connecting conductor connected to each other. The first interlayer connecting conductor passes through some insulating layers. A second interlayer connecting conductor passes through some insulating layers, and is connected in series and is located within the ring-shaped path. A first capacitor conductor is disposed closer to one side of the stacking direction than the first inductor is. The first capacitor conductor is at least partially superposed on the ring-shaped path to define a first capacitor between the first capacitor conductor and the first inductor, and is superposed on a portion of a region surrounded by the ring-shaped path to be connected to the second interlayer connecting conductor.

19 Claims, 9 Drawing Sheets

(56) References Cited

U.S. PATENT DOCUMENTS

2010/0007437 A1  1/2010  Taniguchi
2011/0074526 A1  3/2011  Taniguchi

OTHER PUBLICATIONS

Official Communication issued in corresponding Chinese Patent Application No. 201510800935.2, dated Nov. 6, 2017.

* cited by examiner

ELECTRONIC COMPONENT

BACKGROUND OF THE INVENTION

1. Field of the Invention

The present invention relates to an electronic component, and more particularly, to an electronic component including inductors and capacitors.

2. Description of the Related Art

As electronic components of the related art, an LC composite component disclosed in Japanese Unexamined Patent Application Publication No. 2010-21321, for example, is known. The LC composite component includes an inductor and a capacitor. The inductor is formed in a substantially spiral shape having a central axis extending in the top-bottom direction and is constituted by line electrodes and via-electrodes connected to each other. The capacitor is disposed below the inductor and is constituted by a ground electrode and a capacitor electrode formed substantially in a rectangular shape opposing each other.

In the LC composite component disclosed in Japanese Unexamined Patent Application Publication No. 2010-21321, the inductance value of the inductor is decreased. More specifically, since the inductor and the capacitor are superposed on each other in the top-bottom direction, magnetic flux generated by the inductor passes through the ground electrode and the capacitor electrode. Accordingly, an eddy current is generated in the ground electrode and the capacitor electrode, thereby causing an eddy current loss. As a result, the Q factor of the inductor is decreased.

SUMMARY OF THE INVENTION

Accordingly, preferred embodiments of the present invention provide an electronic component that is capable of significantly reducing or preventing a decrease in the Q factor of an inductor.

According to a preferred embodiment of the present invention, an electronic component includes a multilayer body, a first inductor, a second interlayer connecting conductor, and a first capacitor conductor. The multilayer body includes a plurality of insulating layers stacked on each other in a stacking direction. The first inductor preferably has a spiral or substantially spiral shape extending along the stacking direction while turning around a ring-shaped or substantially ring-shaped path, as viewed from above in the stacking direction. The first inductor includes a plurality of first inductor conductors and a first interlayer connecting conductor connected to each other. The plurality of first inductor conductors are disposed on some of the plurality of insulating layers. The first interlayer connecting conductor passes through one or more of the plurality of insulating layers in the stacking direction. The second interlayer connecting conductor passes through some of the plurality of insulating layers in the stacking direction. The second interlayer connecting conductor is connected in series and is located within the ring-shaped or substantially ring-shaped path as viewed from above in the stacking direction. The first capacitor conductor is disposed closer to one side of the stacking direction than the first inductor is. The first capacitor conductor is at least partially superposed on the ring-shaped or substantially ring-shaped path so as to define a first capacitor between the first capacitor conductor and the first inductor, as viewed from above in the stacking direction, and is superposed on a portion of a region surrounded by the ring-shaped or substantially ring-shaped path so as to be connected to the second interlayer connecting conductor, as viewed from above in the stacking direction.

According to a preferred embodiment of the present invention, it is possible to significantly reduce or prevent a decrease in the Q factor of an inductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
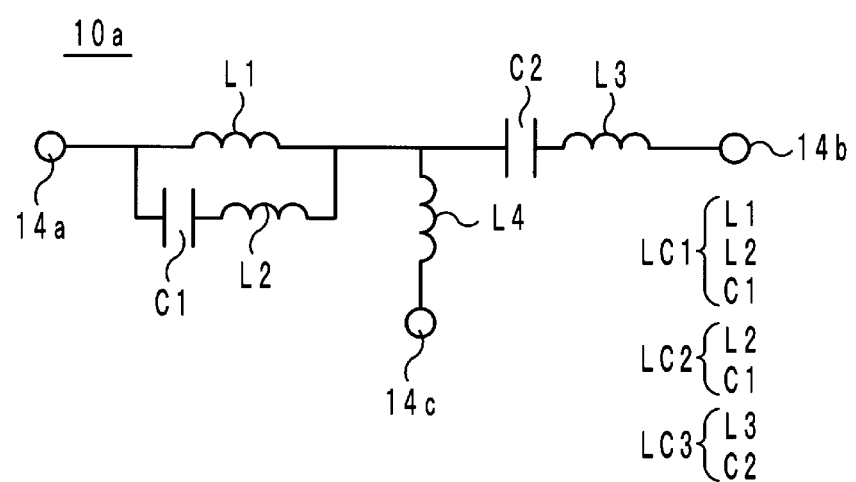
FIG. 1 is an equivalent circuit diagram of an electronic component according to a first preferred embodiment of the present invention.
Figure 2:
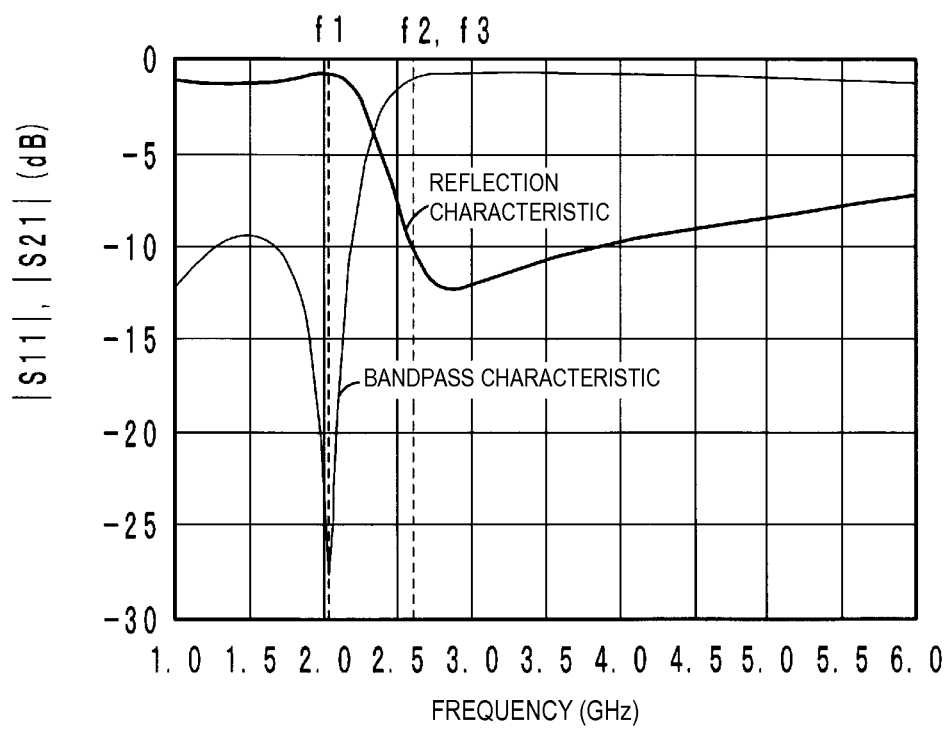
FIG. 2 is a graph illustrating a bandpass characteristic and a reflection characteristic of the electronic component of the first preferred embodiment.

An electronic component 10a according to a first preferred embodiment of the prevent invention will be described below with reference to the accompanying drawings. FIG. 1 is an equivalent circuit diagram of the electronic component 10a of the first preferred embodiment. FIG. 2 is a graph illustrating the bandpass characteristic and reflection characteristic of the electronic component 10a. In FIG. 2, the vertical axis indicates |S11| and |S21|, while the horizontal axis indicates the frequency. S21 represents the value of the ratio of the intensity of a signal output from an outer electrode 14b to the intensity of a signal input through an outer electrode 14a. S11 represents the value of the ratio of the intensity of a signal output from the outer electrode 14a to the intensity of a signal input through the outer electrode 14a.

The equivalent circuit of the electronic component 10a will first be discussed below with reference to FIG. 1. As shown in FIG. 1, the electronic component 10a includes inductors L1 through L4, capacitors C1 and C2, and outer electrodes 14a through 14c as the elements of the equivalent circuit. The electronic component 10a is a high pass filter which allows radio-frequency signals in a higher band than the cutoff frequency to pass therethrough.

The outer electrode 14a is an input terminal into which a radio-frequency signal is input. The outer electrode 14b is an output terminal from which a radio-frequency signal is output. The outer electrode 14c is a ground terminal which is grounded.

The inductor L1, the capacitor C2, and the inductor L3 are electrically connected in series with each other in this order between the outer electrodes 14a and 14b. The inductor L3 and the capacitor C2 define an LC series resonator LC3. The resonant frequency of the LC series resonator LC3 is a frequency f3. The LC series resonator LC3 defines and functions as an impedance matching circuit and significantly reduces or prevents the reflection of a radio-frequency signal having the frequency f3.

The inductor L2 and the capacitor C1 are electrically connected in series with each other and define an LC series resonator LC2. The resonant frequency of the LC series resonator LC2 is a frequency f2. The inductor L2 and the capacitor C1 are also electrically connected to the inductor L1 in parallel with each other. With this configuration, the inductors L1 and L2 and the capacitor C1 define an LC parallel resonator LC1. The resonant frequency of the LC parallel resonator LC1 is a frequency f1. The frequency f2 is slightly higher than the frequency f1 and is equal or substantially equal to the frequency f3.

The inductor L4 is connected between the outer electrode 14c and a node between the inductor L1 and the capacitor C2. The inductor L4 defines and functions as a low pass filter that selects a radio-frequency signal having a frequency lower than the frequency f1 from among radio-frequency signals flowing between the outer electrodes 14a and 14b and transmits the selected radio-frequency signal to the outer electrode 14c.

The electronic component 10a having the unique structure and configuration described above has the bandpass characteristic and reflection characteristic shown in FIG. 2. The bandpass characteristic represents the value of the ratio of the intensity of a radio-frequency signal output from the outer electrode 14b to the intensity of a radio-frequency signal input through the outer electrode 14a. The reflection characteristic represents the value of the ratio of the intensity of a radio-frequency signal output from the outer electrode 14a to the intensity of a radio-frequency signal input through the outer electrode 14a.

The impedance of the LC parallel resonator LC1 is maximized at the frequency f1. Accordingly, the bandpass characteristic indicates that an attenuation pole is generated at the frequency f1. The impedance of the LC series resonator LC2 is significantly reduced or minimized at the frequency f2. Accordingly, the bandpass characteristic indicates that the attenuation at the frequency f2 is small. The frequency f1 is set to be slightly lower than the frequency f2. This makes it possible to identify that the bandpass characteristic sharply fluctuates from f2 to f1, as shown in FIG. 2. That is, the electronic component 10a exhibits high attenuation characteristics.

The impedance of the LC series resonator LC3 is significantly reduced or minimized at the frequency f3. Accordingly, the reflection characteristic indicates that the return loss near the frequency f3 is decreased. The reason for this is that the LC series resonator LC3 defines and functions as an impedance matching circuit and allows a radio-frequency signal having f3 to pass therethrough and transmits it to the outer electrode 14b.

Figure 3:
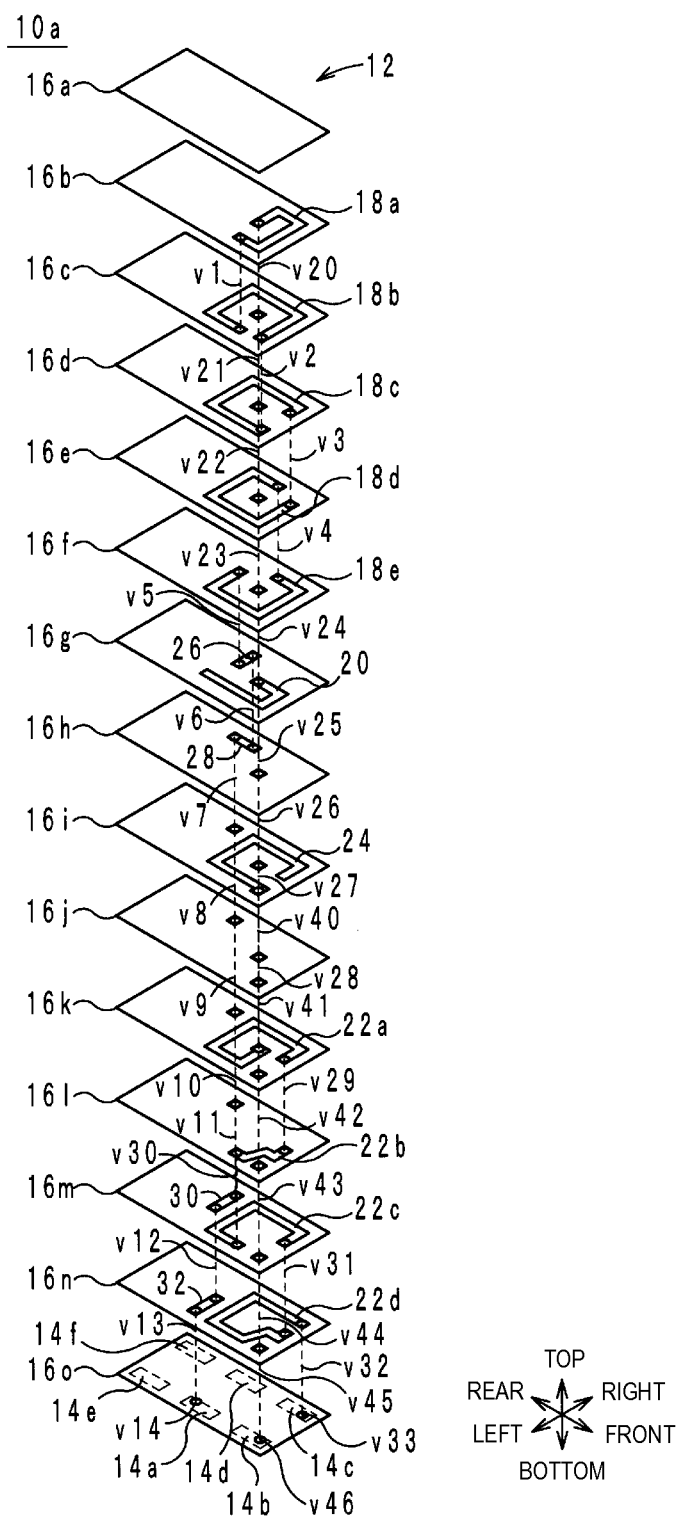
FIG. 3 is an exploded perspective view of the electronic component of the first preferred embodiment of the present invention.

An example of the specific configuration of the electronic component 10a will now be described below with reference to the exploded perspective view of FIG. 3. Hereinafter, the stacking direction of the electronic component 10a is defined as the top-bottom direction, the longitudinal direction of the electronic component 10a, as viewed from above, is defined as the front-rear direction, and the widthwise direction of the electronic component 10a, as viewed from above, is defined as the right-left direction.

The electronic component 10a includes a multilayer body 12, outer electrodes 14a through 14f, inductor conductors 18a through 18e and 22a through 22d, capacitor conductors 20 and 24, and via-hole conductors v1 through v14 (example of an interlayer connecting conductor), v20 through v33, and v40 through v46.

The multilayer body 12 preferably has a rectangular or substantially rectangular parallelepiped shape, and preferably includes insulating layers 16a through 16o stacked on each other from the top side to the bottom side in this order. The insulating layers 16a through 16o are made of an insulating material, such as ceramic, and preferably have a rectangular or substantially rectangular shape, as viewed from above. Hereinafter, the upper surfaces of the insulating layers 16a through 16o will be referred to as "top surfaces", and the lower surfaces thereof will be referred to as "bottom surfaces".

The outer electrodes 14a through 14f are rectangular or substantially rectangular conductive layers disposed on the bottom surface of the insulating layer 16o. The outer electrodes 14c, 14d, and 14f are arranged along the right long side of the insulating layer 16o from the front side to the rear side in this order. The outer electrodes 14b, 14a, and 14e are arranged along the left long side of the insulating layer 16o from the front side to the rear side in this order.

The inductor conductors 18a through 18e are linear conductive layers disposed in the front half regions of the top surfaces of the insulating layers 16b through 16f, respectively. The inductor conductors 18a through 18e are superposed on each other so as to define a square or substantially square ring-shaped path, as viewed from above. The inductor conductors 18a through 18e are structured or configured such that a portion of the ring-shaped path is cut out. One end of the inductor conductor 18a is extended toward the center of the ring-shaped path. Hereinafter, the upstream end portions of the inductor conductors 18a through 18e in the clockwise direction will be referred to as the "upstream ends", while the downstream end portions thereof in the clockwise direction will be referred to as the "downstream ends".

The via-hole conductor v1 passes through the insulating layer 16b in the top-bottom direction, and connects the downstream end of the inductor conductor 18a and the upstream end of the inductor conductor 18b. The via-hole conductor v2 passes through the insulating layer 16c in the top-bottom direction, and connects the downstream end of the inductor conductor 18b and the upstream end of the inductor conductor 18c. The via-hole conductor v3 passes through the insulating layer 16d in the top-bottom direction, and connects the downstream end of the inductor conductor 18c and the upstream end of the inductor conductor 18d. The via-hole conductor v4 passes through the insulating layer 16e in the top-bottom direction, and connects the downstream end of the inductor conductor 18d and the upstream end of the inductor conductor 18e.

The inductor conductors 18a through 18e and the via-hole conductors v1 through v4 having the unique structure and configuration as described above define the inductor L1.

With this structure and configuration, as viewed from above, the inductor L1 preferably has a spiral or substantially spiral shape extending from the top side to the bottom side while turning around the ring-shaped path.

The via-hole conductors v20 through v24 pass through the insulating layers 16b through 16f, respectively, in the top-bottom direction and are connected in series with each other so as to define a single via-hole conductor. The via-hole conductors v20 through v24 are located at or substantially at the center of the ring-shaped path defined by the inductor conductors 18a through 18e, as viewed from above. With this arrangement, the via-hole conductors v20 through v24 extend within the inductor L1 in the top-bottom direction. The top end of the via-hole conductor v20 is connected to the upstream end of the inductor conductor 18a.

The capacitor conductor 20 is disposed below the inductor L1. As viewed from above, the capacitor conductor 20 is at least partially superposed on the ring-shaped path defined by the inductors 18a through 18e so as to define the capacitor C1 between the capacitor conductor 20 and the inductor L1. The capacitor conductor 20 is also superposed on a portion of the region surrounded by the ring-shaped path so as to be connected to the via-hole conductor v24, as viewed from above. The capacitor conductor 20 will be described more specifically. The capacitor conductor 20 is a linear conductive layer disposed in the front half region of the top surface of the insulating layer 16g. The capacitor conductor 20 is superposed on the left side and the left half region of the front side of the ring-shaped path. The capacitor conductor 20 is also extended from the center of the front side of the ring-shaped path toward the center of the ring-shaped path. Accordingly, the capacitor conductor 20 is not entirely superposed on the region surrounded by the ring-shaped path. Hereinafter, the upstream end portion of the capacitor conductor 20 in the clockwise direction will be referred to as the "upstream end", while the downstream end portion thereof in the clockwise direction will be referred to as the "downstream end".

Since the capacitor conductor 20 is a linear conductive layer, it also defines and functions as the inductor L2. That is, the capacitor C1 and the inductor L2 are electrically connected in series with each other. The capacitor conductor 20 is also connected to the inductor conductor 18a through the via-hole conductors v20 through v24. With this unique structure and configuration, the capacitor C1 and the inductor L2 are electrically connected in parallel with the inductor L1.

Concerning the inductor conductor 18e disposed at the bottommost position among the inductor conductors 18a through 18e, if the portion connected to the via-hole conductor v4 is assumed as the start point, the turning direction of the inductor conductor 18e is clockwise. Concerning the capacitor conductor 20, if the portion connected to the via-hole conductor v24 is assumed as the start point, the turning direction of the capacitor conductor 20 is also clockwise. That is, the turning direction of the inductor conductor 18e and that of the capacitor conductor 20 are the same.

Connecting conductors 26, 28, 30, and 32 are linear conductive layers disposed on the top surfaces of the insulating layers 16g, 16h, 16m, and 16n, respectively.

The via-hole conductor v5 passes through the insulating layer 16f in the top-bottom direction, and connects the downstream end of the inductor conductor 18e and the left end of the connecting conductor 26. The via-hole conductor v6 passes through the insulating layer 16g in the top-bottom direction, and connects the right end of the connecting conductor 26 and the front end of the connecting conductor 28. The via-hole conductors v7 through v11 pass through the insulating layers 16h through 16l, respectively, in the top-bottom direction and are connected in series with each other so as to define a single via-hole conductor. The top end of the via-hole conductor v7 is connected to the rear end of the connecting conductor 28. The bottom end of the via-hole conductor v11 is connected to the right end of the connecting conductor 30. The via-hole conductor v12 passes through the insulating layer 16m in the top-bottom direction, and connects the left end of the connecting conductor 30 and the right end of the connecting conductor 32. The via-hole conductors v13 and v14 pass through the insulating layers 16n and 16o, respectively, in the top-bottom direction and are connected in series with each other so as to define a single via-hole conductor. The top end of the via-hole conductor v13 is connected to the left end of the connecting conductor 32. The bottom end of the via-hole conductor v14 is connected to the outer electrode 14a. With this configuration, the downstream end of the inductor conductor 18e is connected to the outer electrode 14a through the via-holes v5 through v14 and by using the connecting conductors 26, 28, 30, and 32. That is, the inductor L1 is electrically connected to the outer electrode 14a.

The inductor conductors 22a through 22d are linear conductive layers disposed in the front half regions of the top surfaces of the insulating layers 16k through 16n, respectively. The inductor conductors 22a through 22d are superposed on each other so as to define a square or substantially square ring-shaped path, as viewed from above. The inductor conductors 22a through 22d are arranged and configured such that a portion of the ring-shaped path is cut out. One end of the inductor conductor 22a is extended toward the center of the ring-shaped path. Hereinafter, the upstream end portions of the inductor conductors 22a through 22d in the clockwise direction will be referred to as the "upstream ends", while the downstream end portions thereof in the clockwise direction will be referred to as the "downstream ends".

The via-hole conductor v29 passes through the insulating layer 16k in the top-bottom direction, and connects the downstream end of the inductor conductor 22a and the upstream end of the inductor conductor 22b. The via-hole conductor v30 passes through the insulating layer 16l in the top-bottom direction, and connects the downstream end of the inductor conductor 22b and the upstream end of the inductor conductor 22c. The via-hole conductor v31 passes through the insulating layer 16m in the top-bottom direction, and connects the downstream end of the inductor conductor 22c and the upstream end of the inductor conductor 22d.

The inductor conductors 22a through 22d and the via-hole conductors v29 through v31 with the unique structure and configuration as described above define the inductor L4. With this configuration, the inductor L4 preferably has a spiral or substantially spiral shape extending from the top side to the bottom side while turning around the ring-shaped path, as viewed from above.

The via-hole conductors v32 and v33 pass through the insulating layers 16n and 16o, respectively, in the top-bottom direction and are connected to each other so as to define a single via-hole conductor. The top end of the via-hole conductor v32 is connected to the downstream end of the inductor conductor 22d. The bottom end of the via-hole conductor v33 is connected to the outer electrode 14c. With this configuration, the inductor L4 is electrically connected to the outer electrode 14c.

The via-hole conductors v25 through v28 pass through the insulating layers 16g through 16j, respectively, in the top-bottom direction and are connected to each other so as to define a single via-hole conductor. The top end of the via-hole conductor v25 is connected to the upstream end of the capacitor conductor 20. The bottom end of the via-hole conductor v28 is connected to the upstream end of the inductor conductor 22a. With this configuration, the inductors L1 and L2 are electrically connected to the inductor L4.

The capacitor conductor 24 is disposed above the inductor L4. As viewed from above, the capacitor conductor 24 is at least partially superposed on the ring-shaped path defined by the inductor conductors 22a through 22d so as to provide the capacitor C2 between the capacitor conductor 24 and the inductor L4. More specifically, the capacitor conductor 24 is a linear conductive layer disposed in the front half region of the top surface of the insulating layer 16i. The capacitor conductor 24 is arranged and configured such that a portion of the ring-shaped path is cut out. Hereinafter, the upstream end portion of the capacitor conductor 24 in the clockwise direction will be referred to as the "upstream end", while the downstream end portion thereof in the clockwise direction will be referred to as the "downstream end".

Since the capacitor conductor 24 is a linear conductive layer, it also defines and functions as the inductor L3. That is, the capacitor C2 and the inductor L3 are electrically connected in series with each other.

The via-hole conductors v40 through v46 pass through the insulating layers 16i through 16o, respectively, in the top-bottom direction and are connected in series with each other so as to define a single via-hole conductor. The via-hole conductors v40 through v46 are located outside of the ring-shaped path defined by the inductor conductors 22a through 22d, as viewed from above. Accordingly, the via-hole conductors v40 through v46 extend outside of the inductor L4 in the top-bottom direction. The top end of the via-hole conductor v40 is connected to the upstream end of the capacitor conductor 24. The bottom end of the via-hole conductor v46 is connected to the outer electrode 14b. With this configuration, the inductor L3 is electrically connected to the outer electrode 14b.

By using the electronic component 10a with the unique structure and configuration described above, it is possible to suppress a decrease in the Q factor of the inductor L1. This will be discussed more specifically. The capacitor conductor 20 is disposed below the inductor L1, and as viewed from above, the capacitor conductor 20 is superposed on a portion of the region surrounded by the ring-shaped path defined by the inductors 18a through 18e so as to be connected to the via-hole conductor v24. That is, the capacitor C1 is not entirely superposed on the ring-shaped path defined by the inductor conductors 18a through 18e. With this configuration, the possibility that magnetic flux generated in the inductor L1 pass through the capacitor conductor 20 is reduced. Accordingly, it is less likely that an eddy current will be generated in the capacitor conductor 20. As a result, it is possible to significantly reduce or prevent a decrease in the Q factor of the inductor L1.

In the electronic component 10a, it is possible to significantly reduce or prevent a decrease in the Q factor of the inductor L1 because of the following reason as well as the above-described reason. More specifically, as viewed from above, the via-hole conductors v20 through v24 are positioned at or substantially at the center of the ring-shaped path defined by the inductor conductors 18a through 18e. Accordingly, the via-hole conductors v20 through v24 extend within the inductor L1 in the top-bottom direction.

Magnetic flux is generated along the top-bottom direction within the inductor L1. That is, the arrangement direction of the inductor conductors 18a through 18e and the generating direction of magnetic flux are the same. Thus, the possibility that magnetic flux generated in the inductor L1 pass through the inductor conductors 18a through 18e is reduced. Accordingly, it is less likely that an eddy current will be generated in the inductor conductors 18a through 18e. As a result, it is possible to significantly reduce or prevent a decrease in the Q factor of the inductor L1.

In the electronic component 10a, it is also possible to reduce the device size. This will be discussed more specifically. As viewed from above, the via-hole conductors v20 through v24 are positioned at or substantially at the center of the ring-shaped path defined by the inductor conductors 18a through 18e. Accordingly, the via-hole conductors v20 through v24 extend within the inductor L1 in the top-bottom direction. Thus, the dimensions of the electronic component 10a in the front-rear direction and/or the right-left direction are smaller than an electronic component in which the via-hole conductors v20 through v24 extend outside of the inductor L1 in the top-bottom direction.

In the electronic component 10a, it is also possible to reduce the device height. This will be discussed more specifically. The capacitor C1 is provided between the inductor conductor 18e and the capacitor conductor 20 opposing each other. That is, the inductor conductor 18e also defines and functions as a capacitor conductor. Normally, two capacitor conductors are required to define a capacitor. In the electronic component 10a, however, a capacitor conductor required to define the capacitor C1 is the capacitor conductor 20 only. Accordingly, the height of the electronic component 10a is able to be significantly reduced.

Second Preferred Embodiment

Figure 4:
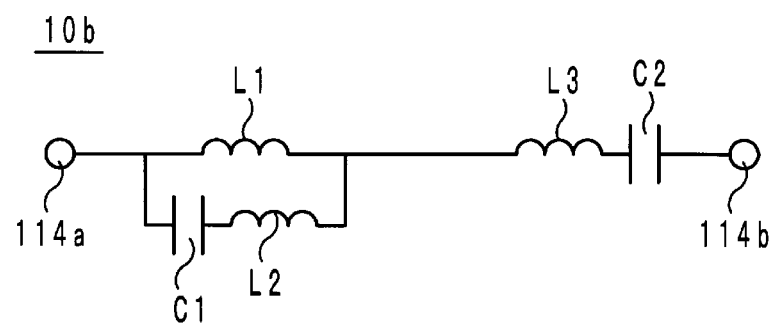
FIG. 4 is an equivalent circuit diagram of an electronic component according to a second preferred embodiment of the present invention.
Figure 5:
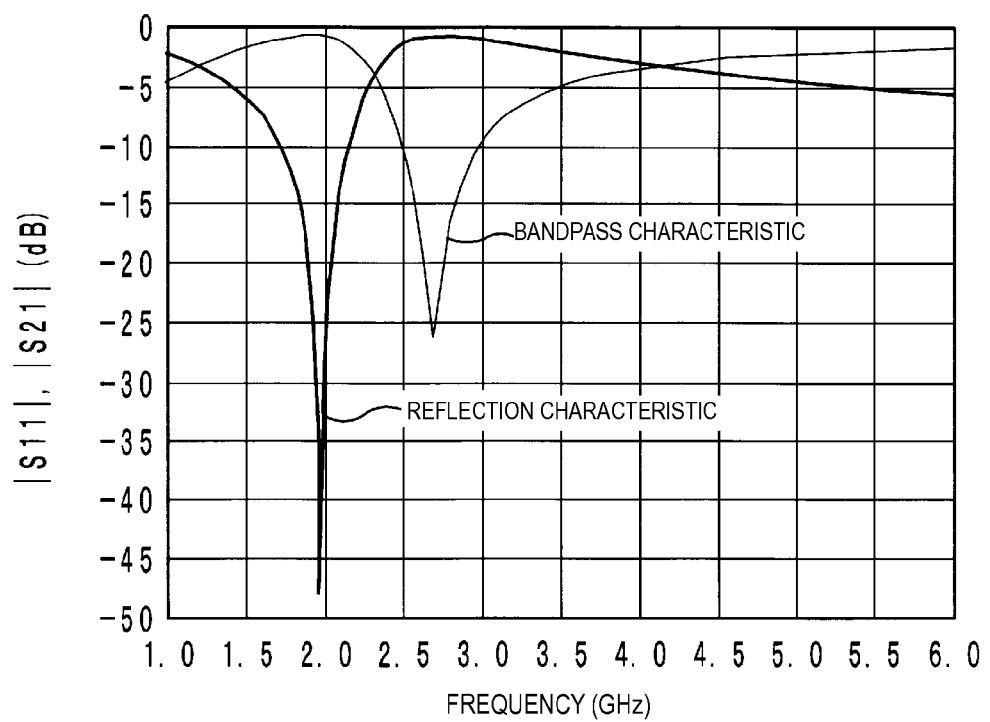
FIG. 5 is a graph illustrating a bandpass characteristic and a reflection characteristic of the electronic component of the second preferred embodiment of the present invention.

An electronic component 10b according to a second preferred embodiment of the present invention will be described below with reference to the accompanying drawings. FIG. 4 is an equivalent circuit diagram of the electronic component 10b of the second preferred embodiment. FIG. 5 is a graph illustrating the bandpass characteristic and reflection characteristic of the electronic component 10b. In FIG. 5, the vertical axis indicates |S11| and |S21|, while the horizontal axis indicates the frequency.

The equivalent circuit of the electronic component 10b will first be discussed below with reference to FIG. 4. The equivalent circuit of the electronic component 10b differs from that of the electronic component 10a in that the inductor L4 and the outer electrode 14c are not provided. The configuration of the electronic component 10b other than this point is the same as that of the electronic component 10a, and an explanation thereof will thus be omitted.

As shown in FIG. 5, the bandpass characteristic of the electronic component 10b indicates that an attenuation pole is generated at a high frequency.

Figure 6:
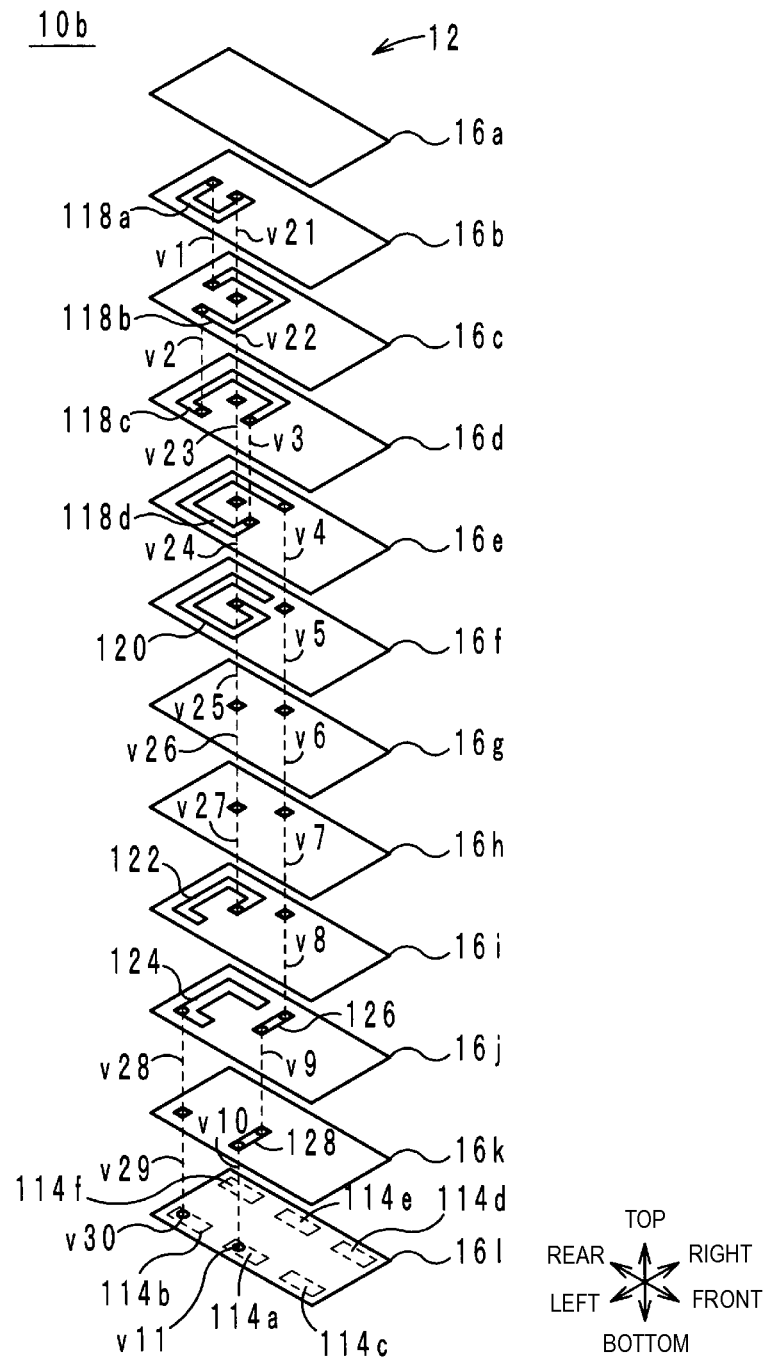
FIG. 6 is an exploded perspective view of the electronic component of the second preferred embodiment of the present invention.

An example of the specific configuration of the electronic component 10b will now be described below with reference to the exploded perspective view of FIG. 6. Hereinafter, the stacking direction of the electronic component 10b is defined as the top-bottom direction, the longitudinal direction of the electronic component 10b, as viewed from above, is defined as the front-rear direction, and the widthwise direction of the electronic component 10b, as viewed from above, is defined as the right-left direction.

The electronic component 10b includes a multilayer body 12, outer electrodes 114a through 114f, inductor conductors 118a through 118d, capacitor conductors 120, 122, and 124, and via-hole conductors v1 through v11 and v21 through v30.

The multilayer body 12 preferably has a rectangular or substantially rectangular parallelepiped shape, and preferably includes insulating layers 16a through 16l stacked on each other from the top side to the bottom side in this order. The insulating layers 16a through 16l are made of an insulating material, such as ceramic, and preferably have a rectangular or substantially rectangular shape, as viewed from above. Hereinafter, the upper surfaces of the insulating layers 16a through 16l will be referred to as "top surfaces", and the lower surfaces thereof will be referred to as "bottom surfaces".

The outer electrodes 114a through 114f are rectangular or substantially rectangular conductive layers disposed on the bottom surface of the insulating layer 16l. The outer electrodes 114d, 114e, and 114f are arranged along the right long side of the insulating layer 16l from the front side to the rear side in this order. The outer electrodes 114c, 114a, and 114b are arranged along the left long side of the insulating layer 16l from the front side to the rear side in this order.

The inductor conductors 118a through 118d are linear conductive layers disposed in the rear half regions of the top surfaces of the insulating layers 16b through 16e, respectively. The inductor conductors 118a through 118d are superposed on each other so as to define a square or substantially square ring-shaped path, as viewed from above. The inductor conductors 118a through 118d are arranged and configured such that a portion of the ring-shaped path is cut out. One end of the inductor conductor 118a is extended toward the center of the ring-shaped path. Hereinafter, the upstream end portions of the inductor conductors 118a through 118d in the clockwise direction will be referred to as the "upstream ends", while the downstream end portions thereof in the clockwise direction will be referred to as the "downstream ends".

The via-hole conductor v1 passes through the insulating layer 16b in the top-bottom direction, and connects the downstream end of the inductor conductor 118a and the upstream end of the inductor conductor 118b. The via-hole conductor v2 passes through the insulating layer 16c in the top-bottom direction, and connects the downstream end of the inductor conductor 118b and the upstream end of the inductor conductor 118c. The via-hole conductor v3 passes through the insulating layer 16d in the top-bottom direction, and connects the downstream end of the inductor conductor 118c and the upstream end of the inductor conductor 118d.

The inductor conductors 118a through 118d and the via-hole conductors v1 through v3 configured as described above define the inductor L1. With this configuration, as viewed from above, the inductor L1 preferably has a spiral or substantially spiral shape extending from the top side to the bottom side while turning around the ring-shaped path.

The via-hole conductors v21 through v24 pass through the insulating layers 16b through 16e, respectively, in the top-bottom direction and are connected in series with each other so as to define a single via-hole conductor. The via-hole conductors v21 through v24 are located at or substantially at the center of the ring-shaped path defined by the inductor conductors 118a through 118d, as viewed from above. Accordingly, the via-hole conductors v21 through v24 extend within the inductor L1 in the top-bottom direction. The top end of the via-hole conductor v21 is connected to the upstream end of the inductor conductor 118a.

The capacitor conductor 120 is disposed below the inductor L1. As viewed from above, the capacitor conductor 120 is at least partially superposed on the ring-shaped path defined by the inductors 118a through 118d so as to provide the capacitor C1 between the capacitor conductor 120 and the inductor L1. The capacitor conductor 120 is also superposed on a portion of the region surrounded by the ring-shaped path so as to be connected to the via-hole conductor v24. The capacitor conductor 120 will be described more specifically. The capacitor conductor 120 is a linear conductive layer disposed in the rear half region of the top surface of the insulating layer 16f. The capacitor conductor 120 is superposed on the left half of the front side, the left side, the rear side, and the rear half of the right side of the ring-shaped path. The capacitor conductor 120 is also extended from the center of the front side of the ring-shaped path toward the center of the ring-shaped path. Accordingly, the capacitor conductor 120 is not entirely superposed on the region surrounded by the ring-shaped path. Hereinafter, the upstream end portion of the capacitor conductor 120 in the clockwise direction will be referred to as the "upstream end", while the downstream end portion thereof in the clockwise direction will be referred to as the "downstream end".

Since the capacitor conductor 120 is a linear conductive layer, it also defines and functions as the inductor L2. That is, the capacitor C1 and the inductor L2 are electrically connected in series with each other. The capacitor conductor 120 is also connected to the inductor conductor 118a through the via-hole conductors v21 through v24. With this configuration, the capacitor C1 and the inductor L2 are electrically connected in parallel with the inductor L1.

Concerning the inductor conductor 118d disposed at the bottommost position among the inductor conductors 118a through 118d, if the portion connected to the via-hole conductor v3 is assumed as the start point, the turning direction of the inductor conductor 118d is clockwise. Concerning the capacitor conductor 120, if the portion connected to the via-hole conductor v24 is assumed as the start point, the turning direction of the capacitor conductor 120 is also clockwise. That is, the turning direction of the inductor conductor 118d and that of the capacitor conductor 120 are the same.

Connecting conductors 126 and 128 are linear conductive layers disposed on the top surfaces of the insulating layers 16j and 16k, respectively.

The via-hole conductors v4 through v8 pass through the insulating layers 16e through 16i, respectively, in the top-bottom direction and are connected in series with each other so as to define a single via-hole conductor. The top end of the via-hole conductor v4 is connected to the downstream end of the inductor conductor 118d. The bottom end of the via-hole conductor v8 is connected to the right end of the connecting conductor 126. The via-hole conductor v9 passes through the insulating layer 16j in the top-bottom direction, and connects the left end of the connecting conductor 126 and the right end of the connecting conductor 128. The via-hole conductors v10 and v11 pass through the insulating layers 16k and 16l, respectively, in the top-bottom direction and are connected in series with each other so as to define a single via-hole conductor. The top end of the via-hole conductor v10 is connected to the left end of the connecting conductor 128. The bottom end of the via-hole conductor v11 is connected to the outer electrode 114a. With this configuration, the inductor L1 is electrically connected to the outer electrode 114a.

The capacitor conductor 122 is a linear conductive layer disposed in the rear half region of the top surface of the insulating layer 16i. As viewed from above, the capacitor conductor 122 is at least partially superposed on the ring-shaped path defined by the inductor conductors 118a through 118d. That is, the capacitor conductor 122 is arranged and configured such that a portion of the ring-shaped path is cut out. One end of the capacitor conductor 122 is extended toward the center of the ring-shaped path. Hereinafter, the upstream end portion of the capacitor conductor 122 in the counterclockwise direction will be referred to as the "upstream end", while the downstream end portion thereof in the counterclockwise direction will be referred to as the "downstream end".

The capacitor conductor 124 is a linear conductive layer disposed in the rear half region of the top surface of the insulating layer 16j. As viewed from above, the capacitor conductor 124 is at least partially superposed on the ring-shaped path defined by the inductor conductors 118a through 118d. That is, the capacitor conductor 124 is arranged and configured such that a portion of the ring-shaped path is cut out. The capacitor conductor 124 is superposed on the capacitor conductor 122, as viewed from above. With this configuration, the capacitor C2 is provided between the capacitor conductors 122 and 124. Hereinafter, the upstream end portion of the capacitor conductor 124 in the clockwise direction will be referred to as the "upstream end", while the downstream end portion thereof in the clockwise direction will be referred to as the "downstream end".

Since the capacitor conductors 122 and 124 are linear conductive layers, they also define and function as the inductor L3. That is, the capacitor C2 and the inductor L3 are electrically connected in series with each other.

The via-hole conductors v25 through 27 pass through the insulating layers 16f through 16h, respectively, in the top-bottom direction and are connected to each other so as to define a single via-hole conductor. The top end of the via-hole conductor v25 is connected to the upstream end of the capacitor conductor 120. The bottom end of the via-hole conductor v27 is connected to the downstream end of the capacitor conductor 122. With this configuration, the inductors L1 and L2 are electrically connected to the inductor L3.

The via-hole conductors v28 through v30 pass through the insulating layers 16j through 16l, respectively, in the top-bottom direction and are connected to each other so as to define a single via-hole conductor. The top end of the via-hole conductor v28 is connected to the upstream end of the capacitor conductor 124. The bottom end of the via-hole conductor v30 is connected to the outer electrode 114b. With this structure and configuration, the capacitor C2 is electrically connected to the outer electrode 114b.

By using the electronic component 10b with the unique structure and configuration described above, the same advantages as those of the electronic component 10a are obtained.

Third Preferred Embodiment

Figure 7:
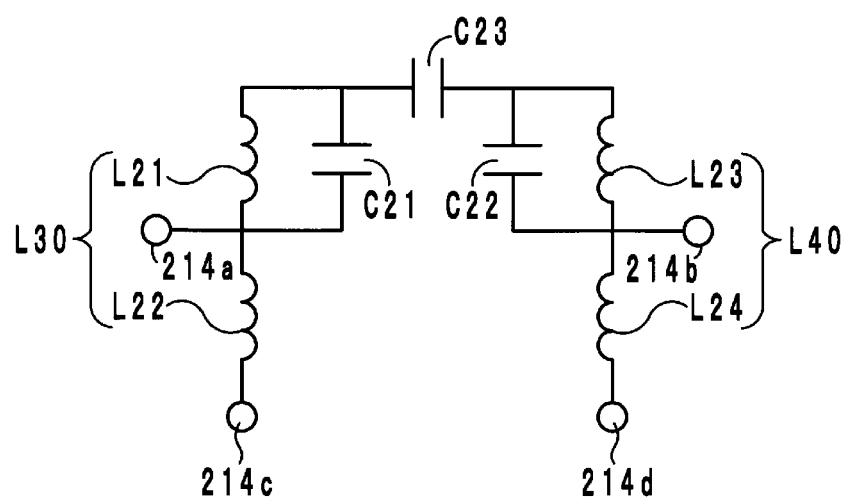
FIG. 7 is an equivalent circuit diagram of an electronic component according to a third preferred embodiment of the present invention.
Figure 8:
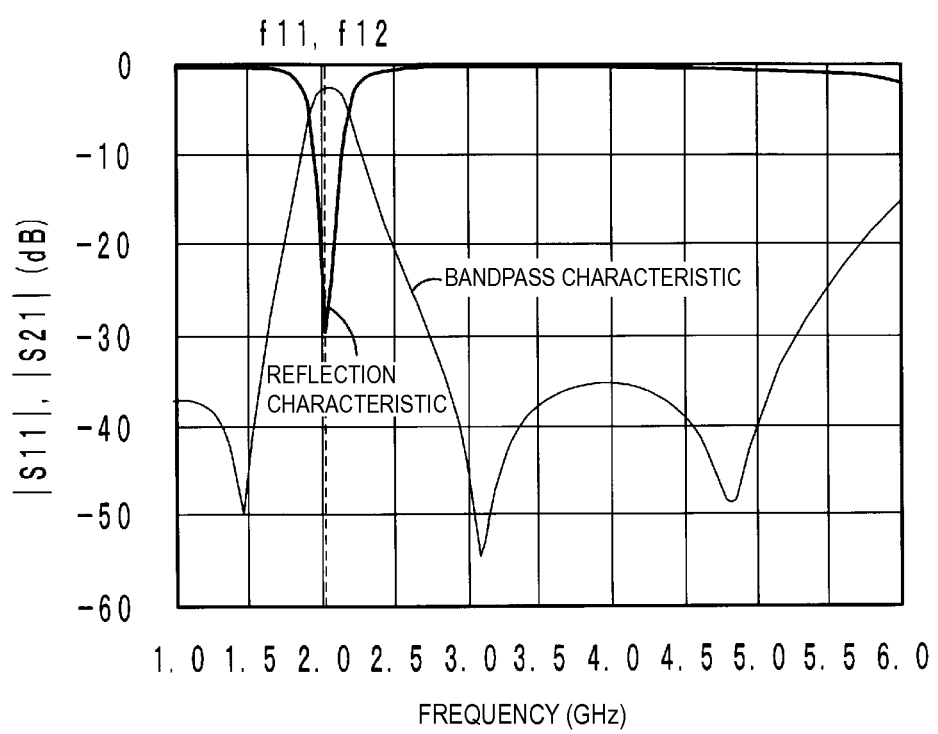
FIG. 8 is a graph illustrating a bandpass characteristic and a reflection characteristic of the electronic component of the third preferred embodiment of the present invention.

An electronic component 10c according to a third preferred embodiment of the present invention will be described below with reference to the accompanying drawings. FIG. 7 is an equivalent circuit diagram of the electronic component 10c of the third preferred embodiment. FIG. 8 is a graph illustrating the bandpass characteristic and reflection characteristic of the electronic component 10c. In FIG. 8, the vertical axis indicates |S11| and |S21|, while the horizontal axis indicates the frequency.

The equivalent circuit of the electronic component 10c will first be discussed below with reference to FIG. 7. As shown in FIG. 7, the electronic component 10c includes inductors L21 through L24, capacitors C21 through C23, and outer electrodes 214a through 214d as the elements of the equivalent circuit. The electronic component 10c is a band pass filter which allows radio-frequency signals in a predetermined band to pass therethrough.

The outer electrode 214a is an input terminal through which a radio-frequency signal is input. The outer electrode 214b is an output terminal from which a radio-frequency signal is output. The outer electrodes 214c and 214d are ground terminals which are grounded.

The inductors L21 and L22 are electrically connected in series with each other. The outer electrode 214a is connected between the inductors L21 and L22. The outer electrode 214c is connected to the end portion of the inductor L22 which is not connected to the inductor L21. The capacitor C21 is electrically connected in parallel with the inductor L21.

The inductors L23 and L24 are electrically connected in series with each other. The outer electrode 214b is connected between the inductors L23 and L24. The outer electrode 214d is connected to the end portion of the inductor L24 which is not connected to the inductor L23. The capacitor C22 is electrically connected in parallel with the inductor L23.

The capacitor C23 is connected between the end portion of the inductor L21 which is not connected to the inductor L22 and the end portion of the inductor L23 which is not connected to the inductor L24.

The electronic component 10c with the unique structure and configuration described above has the bandpass characteristic and reflection characteristic shown in FIG. 8. The bandpass characteristic represents the value of the ratio of the intensity of a radio-frequency signal output from the outer electrode 214b to the intensity of a radio-frequency signal input through the outer electrode 214a. The reflection characteristic represents the value of the ratio of the intensity of a radio-frequency signal output from the outer electrode 214a to the intensity of a radio-frequency signal input into the outer electrode 214a.

The impedance of the LC parallel resonator LC11 and the impedance of the LC parallel resonator LC12 are significantly increased or maximized at the frequencies f11 and f12, respectively. Accordingly, among radio-frequency signals input into the outer electrode 214a, a radio-frequency signal having the frequency f11 and a radio-frequency signal having the frequency f12 are unable to pass through the LC parallel resonators LC11 and LC12, respectively, but pass through the capacitor C23 and are output from the outer electrode 214b. On the other hand, radio-frequency signals other than those having the frequency f11 or f12 pass through the LC parallel resonator LC11 or LC12 and flow from the outer electrode 214c or 214d to a ground. Thus, the electronic component 10c implements a narrow-band pass filter.

Figure 9:
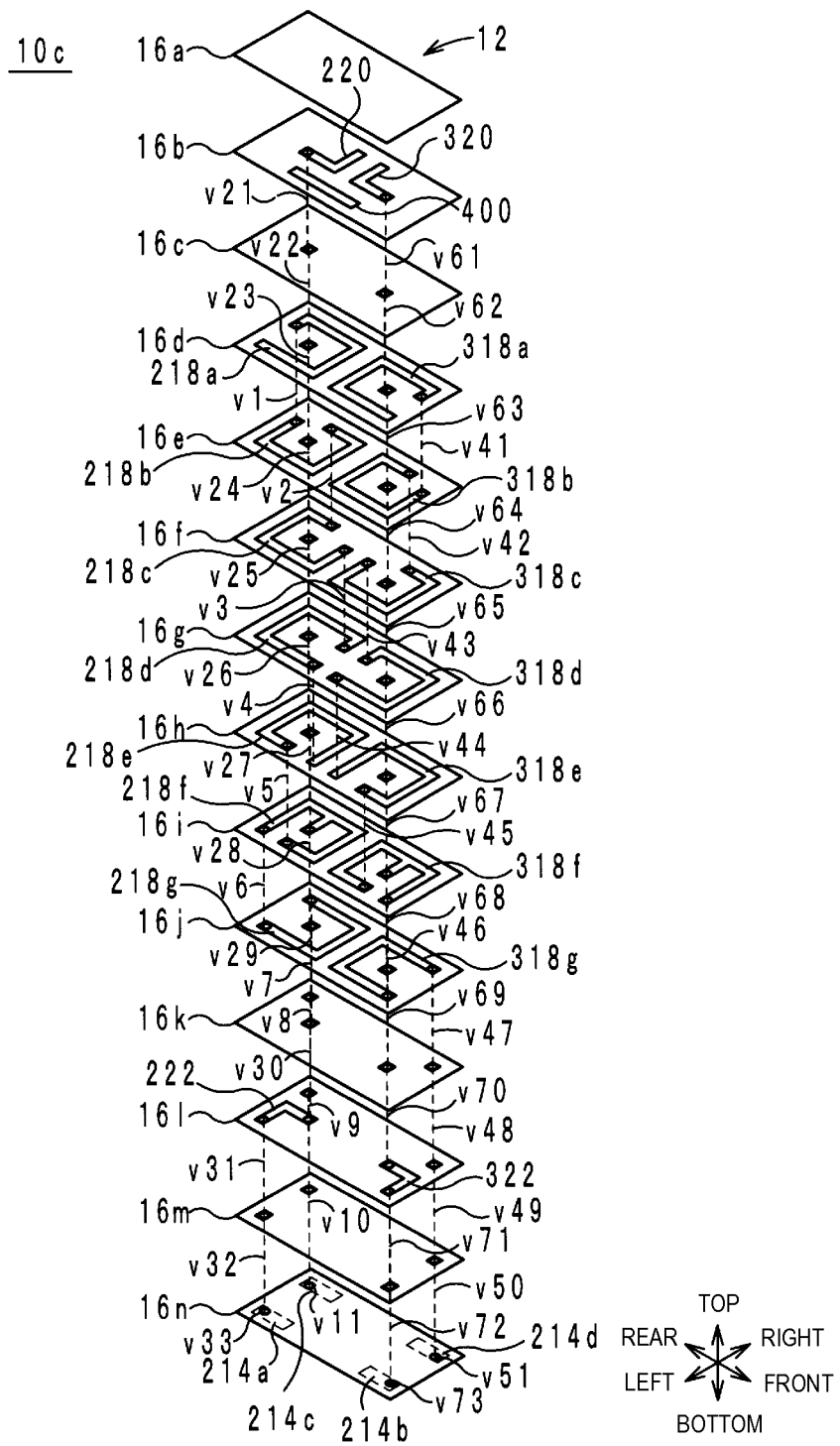
FIG. 9 is an exploded perspective view of the electronic component of the third preferred embodiment of the present invention.

An example of the specific configuration of the electronic component 10c will now be described below with reference to the exploded perspective view of FIG. 9. Hereinafter, the stacking direction of the electronic component 10c is defined as the top-bottom direction, the longitudinal direction of the electronic component 10c, as viewed from above, is defined as the front-rear direction, and the widthwise direction of the electronic component 10c, as viewed from above, is defined as the right-left direction.

The electronic component 10c includes a multilayer body 12, outer electrodes 214a through 214d, inductor conductors 218a through 218g and 318a through 318g, capacitor conductors 220, 320, and 400, connecting conductors 222 and 322, and via-hole conductors v1 through v11, v21 through v33, v41 through v51, and v61 through v73.

The multilayer body 12 preferably has a rectangular or substantially rectangular parallelepiped shape, and preferably includes insulating layers 16*a* through 16*n* stacked on each other from the top side to the bottom side in this order. The insulating layers 16*a* through 16*n* are made of an insulating material, such as ceramic, and are preferably rectangular or substantially rectangular, as viewed from above. Hereinafter, the upper surfaces of the insulating layers 16*a* through 16*n* will be referred to as "top surfaces", and the lower surfaces thereof will be referred to as "bottom surfaces".

The outer electrodes 214*a* through 214*d* are rectangular or substantially rectangular conductive layers disposed on the bottom surface of the insulating layer 16*n*. The outer electrodes 214*c* and 214*d* are arranged along the right long side of the insulating layer 16*n* from the rear side to the front side in this order. The outer electrodes 214*a* and 214*b* are arranged along the left long side of the insulating layer 16*n* from the rear side to the front side in this order.

The inductor conductors 218*a* through 218*g* are linear conductive layers disposed in the rear half regions of the top surfaces of the insulating layers 16*d* through 16*j*, respectively. The inductor conductors 218*a* through 218*g* are superposed on each other so as to define a square or substantially square ring-shaped path, as viewed from above. The inductor conductors 218*a* through 218*g* are arranged and configured such that a portion of the ring-shaped path is cut out. The center of the right side of the ring-shaped path of the inductor conductor 218*f* is extended toward the center of the ring-shaped path. Hereinafter, the upstream end portions of the inductor conductors 218*a* through 218*g* in the counterclockwise direction will be referred to as the "upstream ends", while the downstream end portions thereof in the counterclockwise direction will be referred to as the "downstream ends".

The via-hole conductor v1 passes through the insulating layer 16*d* in the top-bottom direction, and connects the downstream end of the inductor conductor 218*a* and the upstream end of the inductor conductor 218*b*. The via-hole conductor v2 passes through the insulating layer 16*e* in the top-bottom direction, and connects the downstream end of the inductor conductor 218*b* and the upstream end of the inductor conductor 218*c*. The via-hole conductor v3 passes through the insulating layer 16*f* in the top-bottom direction, and connects the downstream end of the inductor conductor 218*c* and the upstream end of the inductor conductor 218*d*. The via-hole conductor v4 passes through the insulating layer 16*g* in the top-bottom direction, and connects the downstream end of the inductor conductor 218*d* and the upstream end of the inductor conductor 218*e*. The via-hole conductor v5 passes through the insulating layer 16*h* in the top-bottom direction, and connects the downstream end of the inductor conductor 218*e* and the upstream end of the inductor conductor 218*f*. The via-hole conductor v6 passes through the insulating layer 16*i* in the top-bottom direction, and connects the downstream end of the inductor conductor 218*f* and the upstream end of the inductor conductor 218*g*.

The inductor conductors 218*a* through 218*g* and the via-hole conductors v1 through v6 with the unique structure and configuration described above define the inductor L30. With this arrangement, as viewed from above, the inductor L30 is preferably has a spiral or substantially spiral shape extending from the top side to the bottom side while turning around the ring-shaped path.

The via-hole conductors v21 through v30 pass through the insulating layers 16*b* through 16*k*, respectively, in the top-bottom direction and are connected in series with each other so as to define a single via-hole conductor. The via-hole conductors v21 through v30 are located at or substantially at the center of the ring-shaped path defined by the inductor conductors 218*a* through 218*g*, as viewed from above. With this arrangement, the via-hole conductors v21 through v30 extend within the inductor L30 in the top-bottom direction.

The bottom end of the via-hole conductor v27 and the top end of the via-hole conductor v28 are connected to the inductor conductor 218*f*. With this configuration, the inductor conductors 218*a* through 218*e* and the area from the upstream end of the inductor conductor 218*f* to the portion thereof extended to the center of the ring-shaped path, and the via-hole conductors v1 through v5 define and function as the inductor L21. The inductor conductor 218*g*, the area from the portion of the inductor conductor 218*f* extended to the center of the ring-shaped path to the downstream end of the inductor conductor 218*f*, and the via-hole conductor v6 define and function as the inductor L22.

The capacitor conductor 220 is disposed above the inductor L30. As viewed from above, the capacitor conductor 220 is at least partially superposed on the ring-shaped path defined by the inductors 218*a* through 218*g* so as to provide the capacitor C21 between the capacitor conductor 220 and the inductor L30. The capacitor conductor 220 is also superposed on a portion of the region surrounded by the ring-shaped path so as to be connected to the via-hole conductor v21, as viewed from above. The capacitor conductor 220 will be described more specifically. The capacitor conductor 220 is a linear conductive layer disposed in the rear half region of the top surface of the insulating layer 16*b*. The capacitor conductor 220 is superposed on the right half of the front side of the ring-shaped path. The capacitor conductor 220 is also extended from the center of the front side of the ring-shaped path toward the center of the ring-shaped path. Accordingly, the capacitor conductor 220 is not entirely superposed on the region surrounded by the ring-shaped path. Hereinafter, the upstream end portion of the capacitor conductor 220 in the counterclockwise direction will be referred to as the "upstream end", while the downstream end portion thereof in the counterclockwise direction will be referred to as the "downstream end".

Concerning the inductor conductor 218*a* disposed at the topmost position among the inductor conductors 218*a* through 218*g*, if the portion connected to the via-hole conductor v1 is assumed as the start point, the turning direction of the inductor conductor 218*a* is clockwise. Concerning the capacitor conductor 220, if the portion connected to the via-hole conductor v21 is assumed as the start point, the turning direction of the capacitor conductor 220 is counterclockwise. That is, the turning direction of the inductor conductor 218*a* and that of the capacitor conductor 220 are opposite.

The connecting conductor 222 is preferably an L-shaped or substantially L-shaped linear conductive layer disposed in the rear half region of the top surface of the insulating layer 16*l*. The bottom end of the via-hole conductor v30 is connected to the front end of the connecting conductor 222. The via-hole conductors v31 through v33 pass through the insulating layers 16*l* through 16*n*, respectively, in the top-bottom direction and are connected to each other so as to define a single via-hole conductor. The top end of the via-hole conductor v31 is connected to the left end of the connecting conductor 222. The bottom end of the via-hole conductor v33 is connected to the outer electrode 214*a*. With this configuration, the capacitor C21 and the inductor L22 are electrically connected to the outer electrode 214a through the via-hole conductors v21 through v33 and by using the connecting conductor 222.

The via-hole conductors v7 through v11 pass through the insulating layers 16j through 16n, respectively, in the top-bottom direction and are connected to each other so as to define a single via-hole conductor. The top end of the via-hole conductor v7 is connected to the downstream end of the inductor conductor 218g. The bottom end of the via-hole conductor v11 is connected to the outer electrode 214c. With this configuration, the inductor L22 is electrically connected to the outer electrode 214c through the via-hole conductors v7 through v11.

The inductor conductors 318a through 318g, the capacitor conductor 320, the connecting conductor 322, and the via-hole conductors v41 through v51 and v61 through v73 are respectively line-symmetrical to the inductor conductors 218a through 218g, the capacitor conductor 220, the connecting conductor 222, and the via-hole conductors v1 through v11 and v21 through v33 with respect to a straight line extending in the right-left direction at the center of the front-rear direction of the insulating layers 16a through 16n. Accordingly, an explanation of the detailed configuration of the inductor conductors 318a through 318g, the capacitor conductor 320, the connecting conductor 322, and the via-hole conductors v41 through v51 and v61 through v73 will be omitted.

The capacitor conductor 400 is a linear conductive layer disposed on the top surface of the insulating layer 16b and extending in the front-rear direction. The capacitor conductor 400 is superposed on the inductor conductors 218a and 318a, as viewed from above. With this configuration, the capacitor C23 is provided between the inductors conductors 218a and 318a via the capacitor conductor 400.

By using the electronic component 10c with the unique structure and configuration as described above, the same advantages as those of the electronic components 10a and 10b are obtained.

In the electronic component 10c, since the impedance of the inductor L22 is able to be set to be a suitable value, a band pass filter with a small insertion loss is implemented. This will be discussed more specifically. The inductor conductor 218f is connected to the via-hole conductors v21 through v30 passing through the inductor L30. With this configuration, the inductor L30 may be regarded as an equivalent series circuit of the inductors L21 and L22. The inductor L22 defines and functions as an impedance matching circuit. Accordingly, it is necessary to design the electronic component 10c so that the inductor L22 will have a suitable impedance value.

In the electronic component 10c, the via-hole conductors v21 through v30 pass within the inductor L30. This makes it possible to connect a desired one of the inductor conductors 218a through 218g to the via-hole conductors v21 through v30. Accordingly, the impedance of the inductor L22 is able to be varied without significantly changing the basic configuration of the inductor conductors 218a through 218g. As a result, in the electronic component 10c, the impedance of the inductor L22 can be set to be a suitable value, and thus, a band pass filter with a small insertion loss is implemented.

Other Preferred Embodiments

An electronic component according to various preferred embodiments of the present invention is not restricted to the electronic components 10a through 10c of the first through third preferred embodiments, and it may be modified within the spirit of the present invention.

The configurations of the electronic components 10a through 10c may be combined in a desired manner.

The via-hole conductors may be replaced by metallic pins (example of an interlayer connecting conductor).

Various preferred embodiments of the present invention is suitably used as an electronic component since it is possible to significantly reduce or prevent a decrease in the Q factor of an inductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An electronic component comprising:
a multilayer body including a plurality of insulating layers stacked on each other in a stacking direction;
a first inductor having a spiral or substantially spiral shape extending along the stacking direction while turning around a ring-shaped or substantially ring-shaped path, as viewed from above in the stacking direction, the first inductor including a plurality of first inductor conductors and a first interlayer connecting conductor connected to each other, the plurality of first inductor conductors being disposed on some of the plurality of insulating layers, the first interlayer connecting conductor passing through one or more of the plurality of insulating layers in the stacking direction;
a plurality of second interlayer connecting conductors that pass through some of the plurality of insulating layers in the stacking direction, are connected in series with each other, and are located within the ring-shaped or substantially ring-shaped path as viewed from above in the stacking direction; and
a first capacitor conductor that is disposed closer to one side of the stacking direction than the first inductor is, has a linear shape while turning around the plurality of second interlayer connecting conductors, and is at least partially superposed on the ring-shaped or substantially ring-shaped path so as to define a first capacitor between the first capacitor conductor and the first inductor, as viewed from above in the stacking direction, and is superposed on a portion of a region surrounded by the ring-shaped or substantially ring-shaped path so as to be connected to the plurality of second interlayer connecting conductors at one end portion of the first capacitor conductor and not connected to any conductors at another end portion of the first capacitor conductor, as viewed from above in the stacking direction.

2. The electronic component according to claim 1, wherein, one of the plurality of first inductor conductors is located closest to the one side of the stacking direction, a turning direction of the one of the plurality of first inductor conductors assuming that a portion of the one of the plurality of first inductor conductors connected to the first interlayer connecting conductor is a start point is opposite to a turning direction of the first capacitor conductor assuming that the one end portion of the first capacitor conductor connected to the plurality of second interlayer connecting conductors is a start point.

3. The electronic component according to claim 2, wherein one of the plurality of first inductor conductors is connected to the plurality of second interlayer connecting conductors.

4. The electronic component according to claim 1, wherein the first inductor and the first capacitor define a first LC parallel resonator.

5. The electronic component according to claim 4, further comprising:
- a second inductor having a spiral or substantially spiral shape extending along the stacking direction while turning around a ring-shaped or substantially ring-shaped path, as viewed from above in the stacking direction, the second inductor including a plurality of second inductor conductors and a third interlayer connecting conductor connected to each other, the plurality of second inductor conductors being disposed on some of the plurality of insulating layers, the third interlayer connecting conductor passing through some of the plurality of insulating layers in the stacking direction;
- at least one fourth interlayer connecting conductor that passes through some of the plurality of insulating layers in the stacking direction and is located within the ring-shaped or substantially ring-shaped path as viewed from above in the stacking direction;
- a second capacitor conductor that is disposed closer to one side of the stacking direction than the second inductor is and that is at least partially superposed on the ring-shaped or substantially ring-shaped path so as to define a second capacitor between the second capacitor conductor and the second inductor, as viewed from above in the stacking direction, and is superposed on a portion of a region surrounded by the ring-shaped or substantially ring-shaped path so as to be connected to the fourth interlayer connecting conductor, as viewed from above in the stacking direction; and
- a third capacitor conductor that is superposed on the first and second inductors so as to define a third capacitor between the first and second inductors, as viewed from above in the stacking direction; wherein
- the second inductor and the third capacitor define a second LC parallel resonator; and
- the first LC parallel resonator, the second LC parallel resonator, and the third capacitor define a band pass filter.

6. The electronic component according to claim 5, wherein one of the plurality of first inductor conductors is connected to the plurality of second interlayer connecting conductors.

7. The electronic component according to claim 4, wherein one of the plurality of first inductor conductors is connected to the plurality of second interlayer connecting conductors.

8. The electronic component according to claim 4, wherein the first capacitor conductor is located below the first inductor in the multilayer body.

9. The electronic component according to claim 4, wherein the first LC parallel resonator defines a high pass filter.

10. The electronic component according to claim 1, wherein the first interlayer connecting conductor and the plurality of second interlayer connecting conductors are defined by via-hole conductors.

11. The electronic component according to claim 1, wherein the plurality of first inductor conductors are defined by linear conductive layers located in front half regions of top surfaces of some of the plurality of insulating layers.

12. The electronic component according to claim 1, wherein one of the plurality of first inductor conductors is connected to the plurality of second interlayer connecting conductors.

13. The electronic component according to claim 1, wherein the first capacitor conductor is defined by a linear conductive layer located in a front half region of a top surface of one of the plurality of insulating layers.

14. The electronic component according to claim 1, wherein the plurality of second interlayer connecting conductors are defined by via-hole conductors that are located at or substantially at a center of the ring-shaped or substantially path.

15. The electronic component according to claim 1, wherein one of the first inductor conductors defines a capacitor conductor.

16. The electronic component according to claim 1, wherein the first capacitor conductor is the only capacitor conductor included in the first capacitor.

17. The electronic component according to claim 1, further comprising connecting conductors that are defined by L-shaped or substantially L-shaped linear conductive layers located on rear half regions of top surfaces of some of the plurality of insulating layers.

18. A high pass filter comprising the electronic component according to claim 1.

19. A band pass filter comprising the electronic component according to claim 1.

* * * * *